United States Patent
Kim et al.

(10) Patent No.: US 8,274,210 B2
(45) Date of Patent: Sep. 25, 2012

(54) HALOSILICATE PHOSPHOR AND WHITE LIGHT EMITTING DEVICE INCLUDING THE SAME

(75) Inventors: Tae-gon Kim, Yongin-si (KR); Shunichi Kubota, Yongin-si (KR); Young-sic Kim, Yongin-si (KR); Seoung-jae Im, Yongin-si (KR)

(73) Assignees: Samsung Electronics Co., Ltd. (KR); Samsung Electro-Mechanics Co., Ltd. (KR)

( * ) Notice: Subject to any disclaimer, the term of this patent is extended or adjusted under 35 U.S.C. 154(b) by 333 days.

(21) Appl. No.: 12/556,369

(22) Filed: Sep. 9, 2009

(65) Prior Publication Data

US 2010/0156274 A1 Jun. 24, 2010

(30) Foreign Application Priority Data

Dec. 18, 2008 (KR) .................. 10-2008-0129410

(51) Int. Cl.
*C09K 11/61* (2006.01)
*C09K 11/59* (2006.01)
*H01L 33/00* (2010.01)

(52) U.S. Cl. ........... 313/503; 252/301.4 R; 252/301.4 F; 252/301.4 H

(58) Field of Classification Search .................. 313/503; 252/301.4 F, 301.4 R, 301.4 H
See application file for complete search history.

(56) References Cited

U.S. PATENT DOCUMENTS

| 5,034,607 A | 7/1991 | McAllister et al. |
| 2003/0006469 A1 | 1/2003 | Ellens et al. |
| 2005/0104503 A1 | 5/2005 | Ellens et al. |
| 2006/0028122 A1* | 2/2006 | Wang et al. ............ 313/503 |
| 2006/0081814 A1* | 4/2006 | Shida et al. .......... 252/301.4 F |
| 2007/0125982 A1 | 6/2007 | Tian et al. |
| 2007/0145879 A1 | 6/2007 | Abramov et al. |
| 2008/0036364 A1 | 2/2008 | Li et al. |
| 2008/0116786 A1* | 5/2008 | Wang et al. ............ 313/503 |
| 2008/0128679 A1 | 6/2008 | Tian et al. |

FOREIGN PATENT DOCUMENTS

| JP | 2003-535478 A | 11/2003 |
| JP | 2006-219636 A | 8/2006 |
| JP | 2007-217605 A | 8/2007 |
| JP | 2007-231250 A | 9/2007 |
| KR | 1020060093259 A | 8/2006 |

(Continued)

OTHER PUBLICATIONS

Ding, W. et al., A novel orange phosphor of Eu2+-activated calcium chlorosilicate for white light-emitting diodes, J. Solid State Chem. (2006); 179: pp. 3582-3585.

(Continued)

*Primary Examiner* — Karabi Guharay
(74) *Attorney, Agent, or Firm* — Cantor Colburn LLP

(57) ABSTRACT

A halosilicate phosphor represented by Formula 1

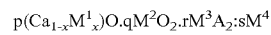

$p(Ca_{1-x}M^1_x)O \cdot qM^2O_2 \cdot rM^3A_2 : sM^4$ wherein $M^1$ includes at least one selected from a group consisting of $Sr^{2+}$ and $Ba^{2+}$; $M^2$ includes at least one selected from a group consisting of $Si^{4+}$ and $Ge^{4+}$; $M^3$ includes at least one selected from a group consisting of $Ca^{2+}$, $Sr^{2+}$ and $Ba^{2+}$; $M^4$ includes at least one selected from a group consisting of $Eu^{2+}$, $Mn^{2+}$, $Sb^{2+}$, $Ce^{3+}$, $Pr^{3+}$, $Nd^{3+}$, $Sm^{3+}$, $Tb^{3+}$, $Dy^{3+}$, $Ho^{3+}$, $Er^{3+}$, $Yb^{3+}$ and $Bi^{3+}$; A includes at least one selected from a group consisting of $F^-$, $Cl^-$, $Br^-$ and $I^-$; and wherein $0 \leq x < 1$, $1.8 \leq p \leq 2.2$, $0.8 \leq q \leq 1.2$, $1 < r/q < 3$ and $0 < s < 0.5$.

9 Claims, 7 Drawing Sheets

FOREIGN PATENT DOCUMENTS

| | | |
|---|---|---|
| KR | 1020070003377 A | 1/2007 |
| KR | 1020070042924 A | 4/2007 |
| KR | 1020070106570 A | 11/2007 |
| KR | 1020080009212 A | 1/2008 |
| WO | 2007/109978 A1 | 10/2007 |

OTHER PUBLICATIONS

Liu, J. et al., Eu2+-Doped High-Temperature Phase Ca3SiO4Cl2 a Yellowish Orange Phosphor for White Light-Emitting Diodes, J. Electrochem. Soc., (2005); 152: pp. G880-G884.

* cited by examiner

HALOSILICATE PHOSPHOR AND WHITE LIGHT EMITTING DEVICE INCLUDING THE SAME

CROSS-REFERENCE TO RELATED APPLICATION

This application claims priority to Korean Patent Application No. 10-2008-0129410, filed on Dec. 18, 2008 and all the benefits accruing therefrom under 35 U.S.C. §119, the content of which in its entirety is herein incorporated by reference.

BACKGROUND

1. Field

The following disclosure relates to a halosilicate phosphor and a white light emitting device including the halosilicate phosphor. More particularly, one or more exemplary embodiments relate to a halosilicate phosphor having a large full width at half maximum ("FWHM") and a white light emitting device including the halosilicate phosphor.

2. Description of the Related Art

A conventional optical system may include fluorescent lamps or incandescent lamps. Fluorescent lamps, however, cause environmental problems due to high levels of mercury (Hg) included therein. Also, conventional optical systems have very short lifetimes and/or low efficiencies and thus are unsuitable for use energy saving applications. Therefore, research is being performed to develop white light emitting devices having high efficiencies and extended lifetimes.

White light emitting devices are able to produce white light using three methods as follows. In one method, red, green and blue phosphors may be excited by an ultraviolet light emitting diode ("UV LED") acting as a light source to produce the white light. In another method, red and green phosphors may be excited by a blue light emitting diode ("LED") acting as a light source to produce the white light. In the last method, a yellow phosphor may be excited by a blue LED acting as a light source to produce the white light.

According to the method for producing white light by exciting a yellow phosphor using a blue LED as a light source, the white light is generally produced by combining the blue LED with $Y_3Al_5O_{12}:Ce^{3+}$, $Tb_3Al_5O_{12}:Ce^{3+}$, $(Sr,Ba)_2SiO_4:Eu^{2+}$, or the like as the yellow phosphor. In particular, $Y_3Al_5O_{12}:Ce^{3+}$ is known as a phosphor suitable for use in a white light emitting device due to its excellent efficiency and wide emitting bands. However, the color rendering properties of the $Y_3Al_5O_{12}:Ce^{3+}$ phosphor are generally insufficient, and thus only cold white light may be generated using this method due to an insufficient red light emission.

To address the above deficiencies, a silicate-based phosphor has been developed to be used as an orange-yellow phosphor. A white light emitting device generating white light by exciting the silicate-based phosphor using a blue LED light source is known.

SUMMARY

One or more exemplary embodiments include a halosilicate phosphor having a large full width at half maximum ("FWHM").

One or more exemplary embodiments include a method of preparing the halosilicate phosphor.

One or more exemplary embodiments include a white light emitting device that includes the halosilicate phosphor and thus has excellent color rendering properties.

Additional aspects, advantages and features will be set forth in part in the description which follows and, in part, will be apparent from the description, or may be learned by practice of the invention.

To achieve the above and/or other aspects, one or more embodiments may include a halosilicate phosphor represented by Formula 1.

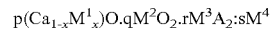

wherein $M^1$ comprises at least one selected from a group consisting of $Sr^{2+}$ and $Ba^{2+}$, $M^2$ comprises at least one selected from a group consisting of $Si^{4+}$ and $Ge^{4+}$, $M^3$ comprises at least one selected from a group consisting of $Ca^{2+}$, $Sr^{2+}$ and $Ba^{2+}$, $M^4$ comprises at least one selected from a group consisting of $Eu^{2+}$, $Mn^{2+}$, $Sb^{2+}$, $Ce^{3+}$, $Pr^{3+}$, $Nd^{3+}$, $Sm^{3+}$, $Tb^{3+}$, $Dy^{3+}$, $Ho^{3+}$, $Er^{3+}$, $Yb^{3+}$ and $Bi^{3+}$, A comprises at least one selected from a group consisting of $F^-$, $Cl^-$, $Br^-$ and $I^-$, $0 \leq x < 1$, $1.8 \leq p \leq 2.2$, $0.8 \leq q \leq 1.2$, $1 < r/q < 3$ and $0 < s < 0.5$.

In one exemplary embodiment the halosilicate phosphor may have a FWHM of about 125 nm to about 220 nm in emission spectra.

To achieve the above and/or other aspects, one or more exemplary embodiments include a white light emitting device including a light emitting diode ("LED") and the halosilicate phosphor.

In one exemplary embodiment the LED may be either a blue LED or an ultraviolet light emitting diode ("UV LED").

In one exemplary embodiment the white light emitting device may further include at least one selected from a group consisting of a blue phosphor, a green phosphor and a red phosphor.

The blue phosphor may include at least one selected from a group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$ and $Sr_2Si_3O_8 \cdot 2SrCl_2:Eu^{2+}$; and $Ba_3MgSi_2O_8:Eu^{2+}$ and $(Sr,Ca)_{10}(PO_4)_6 \cdot nB_2O_3:Eu^{2+}$.

The green phosphor may include at least one selected from a group consisting of $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+}$, $Mn^{2+}$; and $BaMg_2Al_{16}O_{27}:Eu^{2+}$, $Mn^{2+}$.

The red phosphor may include at least one selected from a group consisting of $(Ba,Sr,Ca)_2Si_5N_8:Eu^{2+}$; $(Sr,Ca)AlSiN_3:Eu^{2+}$; $Y_2O_3:Eu^{3+},Bi^{3+}$; $(Ca,Sr)S:Eu^{2+}$; $CaLa_2S_4:Ce^{3+}$; $(Sr,Ca,Ba)_2P_2O_7:Eu^{2+},Mn^{2+}$; $(Ca,Sr)_{10}(PO_4)_6(F,Cl):E^{2+},Mn^{2+}$; $(Y,Lu)_2WO_6:Eu^{3+},Mo^{6+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+},Bi^{3+}$ and $(Ba,Sr,Ca)MgP_2O_7:Eu^{2+},Mn^{2+}$.

In one exemplary embodiment the halosilicate phosphor may have a peak wavelength of about 520 nm to about 670 nm in emission spectra.

In exemplary embodiments the white light emitting device may be used in a traffic light, a light source of communication devices, a backlight of a display device, or illumination applications.

BRIEF DESCRIPTION OF THE DRAWINGS

These and/or other aspects, advantages, and features of this disclosure will become apparent and more readily appreciated from the following description of the embodiments, taken in conjunction with the accompanying drawings of which.

DETAILED DESCRIPTION

Figure 1:
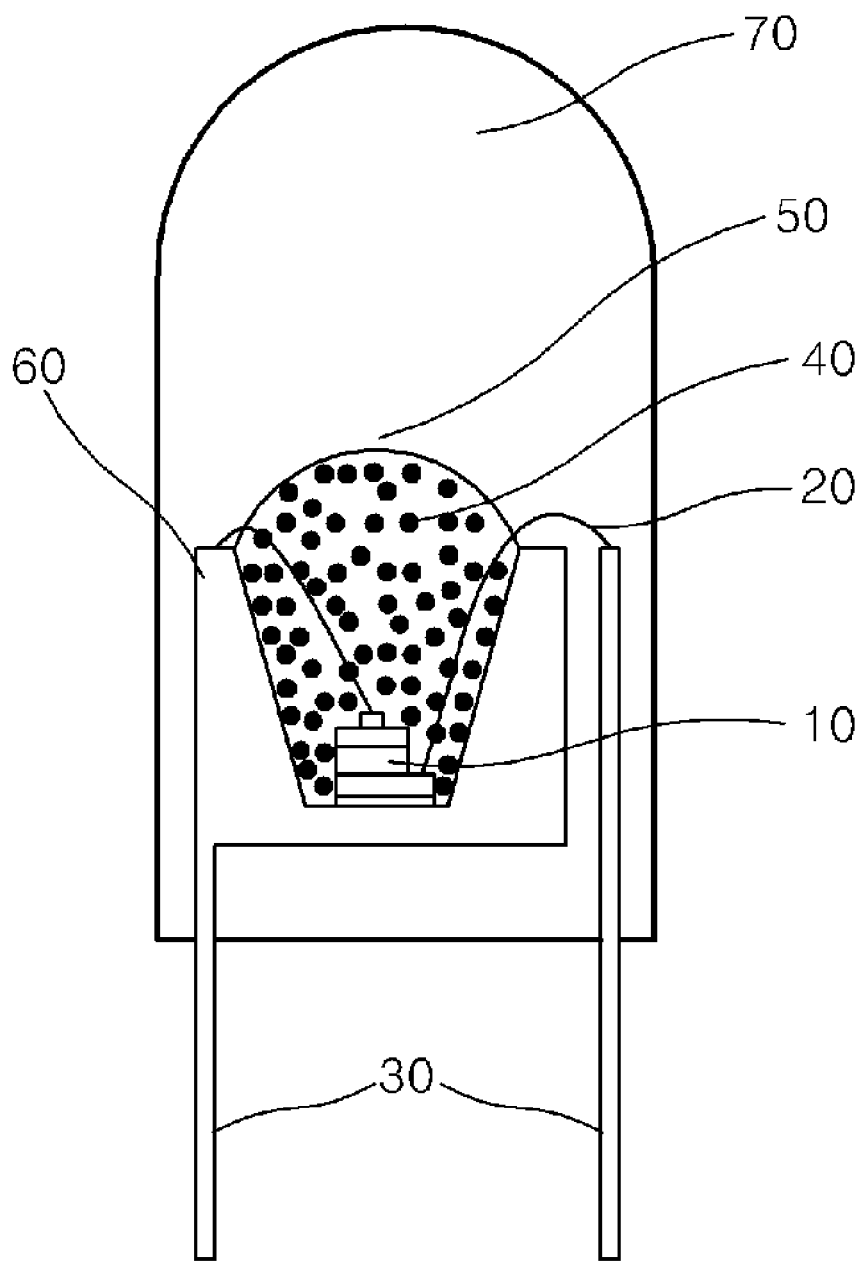
FIG. 1 is a schematic view illustrating an exemplary embodiment of the structure of a white light emitting device.

This disclosure will now be described more fully hereinafter with reference to the accompanying drawings, in which embodiments of the disclosure are shown. The exemplary embodiments may, however, be embodied in many different forms and should not be construed as limited to the embodiments set forth herein. Rather these embodiments are provided so that this disclosure will be thorough and complete, and will fully convey the concepts described herein to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of this disclosure.

Hereinafter, the exemplary embodiments will be described in detail with reference to the accompanying drawings.

All methods described herein can be performed in a suitable order unless otherwise indicated herein or otherwise clearly contradicted by context. The use of any and all examples, or exemplary language (e.g., "such as"), is intended merely for illustration and does not pose a limitation on the scope of the disclosure unless otherwise claimed. No language in the specification should be construed as indicating that any non-claimed element is essential.

One or more exemplary embodiments include a halosilicate phosphor represented by Formula 1.

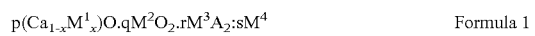

$$p(Ca_{1-x}M^1_x)O.qM^2O_2.rM^3A_2:sM^4 \qquad \text{Formula 1}$$

wherein $M^1$ comprises at least one selected from a group consisting of $Sr^{2+}$ and $Ba^{2+}$;

$M^2$ comprises at least one selected from a group consisting of $Si^{4+}$ and $Ge^{4+}$;

$M^3$ comprises at least one selected from a group consisting of $Ca^{2+}$, $Sr^{2+}$ and $Ba^{2+}$;

$M^4$ comprises at least one selected from a group consisting of $Eu^{2+}$, $Mn^{2+}$, $Sb^{2+}$, $Ce^{3+}$, $Pr^{3+}$, $Nd^{3+}$, $Sm^{3+}$, $Tb^{3+}$, $Dy^{3+}$, $Ho^{3+}$, $Er^{3+}$, $Yb^{3+}$ an $Bi^{3+}$;

A comprises at least one selected from a group consisting of F⁻, Cl⁻, Br⁻ and I⁻; and wherein $0 \leq x < 1$, $1.8 \leq p \leq 2.2$, $0.8 \leq q \leq 1.2$, $1 < r/q < 3$ and $0 < s < 0.5$.

In Formula 1, "." indicates the combination of a metal oxide and a metal halide reacting in order to prepare a phosphor according to an exemplary embodiment.

In exemplary embodiments the halosilicate phosphor may absorb light in the wavelength range of about 360 nanometers (nm) to about 470 nm. In other exemplary embodiments the halosilicate phosphor may emit visible light having a peak wavelength of from about 520 nm to about 670 nm according to the compositions of the metal ions. Thus, the halosilicate phosphor is a material having excellent emission properties over a wide range of wavelengths from green to orange. In one exemplary embodiment, the halosilicate phosphor has a far wider full width at half maximum ("FWHM") in a wavelength range of about 125 to about 220 nm as compared to a conventional $Y_3Al_5O_{12}:Ce^{3+}$ phosphor or $Sr_2SiO_4:Eu^{2+}$ phosphor. In one exemplary embodiment the halosilicate phosphor may be applied to a blue light emitting diode ("LED") either alone or with a small amount of an additional phosphor. The halosilicate phosphor may be applied to an ultraviolet light emitting diode ("UV LED") with the addition of blue, green and/or red phosphors in order to fabricate a white light emitting device having excellent color rendering properties and excellent color reproduction properties. The wide band emission may occur since at least two phases of the halosilicate are mixed. That is, a relative intensity of light emitted from each of the phases of the halosilicate phosphor may vary according to the r/q ratio, which is defined as the mixing ratio where r is a halide and q is an oxide.

In exemplary embodiments r is selected from at least one of a group consisting of Ca, Sr and Ba halides and q is selected from at least one of a group consisting of Si and Ge oxides. The halide and oxide are selected in order to change the overall tones of the emission. In the yellow light emission, the contribution of the green light emission increases as the r/q ratio increases, and the contribution of the orange light emission increases as the r/q ratio decreases. Thus, if the luminosity factor of the light and the color rendering properties are taken into consideration, a high quality yellow phosphor may be combined with a blue LED to generate a white light in a range of from about $1 < r/q <$ about 3 may be prepared.

In exemplary embodiments the halosilicate phosphor may be prepared from a) a Ca oxide alone or from a mixture of a Ca oxide mixed with at least one of a Sr oxide and a Ba oxide; b) a Si oxide alone or from a mixture of a Si oxide and a Ge oxide; c) from an Eu oxide alone or from a mixture of an Eu oxide and an oxide of at least one metal selected from a group consisting of Mn, Sb, Ce, Pr, Nd, Sm, Tb, Dy, Ho, Er, Yb and Bi and d) from a halide of Ca, Sr, Ba or any mixture thereof.

In exemplary embodiments the amount of the a), b), c) and d) components may be selected such that p, q, r and s are within the ranges described in Formula 1.

In one exemplary embodiment, if a Ca oxide is mixed with at least one of the group consisting of a Sr oxide and a Ba oxide, then the molar ratio of (Sr+Ba):Ca may be in a range of about 0.0001:1 to about 2:3.

In addition, in one exemplary embodiment, if a Si oxide is mixed with a Ge oxide, the molar ratio of Ge:Si may be in a range of about 0.0001:1 to about 1:3.

In addition, in one exemplary embodiment, if an Eu oxide is mixed with an oxide of at least one metal selected from a group consisting of Mn, Sb, Ce, Pr, Nd, Sm, Tb, Dy, Ho, Er, Yb and Bi, then the molar ratio of A:Eu may be in a range of about 0.0001:1 to about 9:1, wherein A includes at least one metal selected from the group consisting of Mn, Sb, Ce, Pr, Nd, Sm, Tb, Dy, Ho, Er, Yb and Bi.

Herein, the reactant is shown as an oxide since the reactant turns to the oxide form at a high temperature synthesis even if the reactant is a precursor of any other form such as a carbonate, a nitrate, a hydroxide, or an acetate. Therefore, if a molar ratio of an oxide of the starting material is within the above-described range, the reaction precursor may be present in various other forms such as a carbonate, a nitrate, a hydroxide, an acetate, etc. in addition to the metal oxide. Among the reaction precursors of the above-described halosilicate phosphor, a halide of Ca, Sr, Ba or mixtures thereof may function as a constituent element of a phosphor having at least two phases. Since the melting point of the Ca, Sr or Ba halide is equal to or less than a temperature of about 800 degrees Celsius (° C.), the Ca, Sr or Ba halide functions as a flux to increase the crystallinity of the halosilicate at a temperature close to about 1000° C. Thus, there is no need to add a material used as a flux in order to produce high-quality crystals.

In exemplary embodiments, the white light emitting device may produce a white light having a high color rendering index, and thus may be applied as a high-quality illuminating application which is required in, for example, medical applications, food exhibitions, museums, and art galleries.

In exemplary embodiments the halosilicate phosphor may be prepared using any various known methods, such as a solid phase method, a liquid phase method, or a vaporous phase method, without limitation.

In one exemplary embodiment if the halosilicate phosphor is prepared using the solid phase method, a mixture of powder of a Ca oxide (alone or in a mixture of a Ca oxide with at least one of a Sr oxide or a Ba oxide); a Si oxide (alone or in a mixture of a Si oxide with a Ge oxide); an Eu oxide (alone or in a mixture of an Eu oxide with an oxide of at least one metal selected from a group consisting of Mn, Sb, Ce, Pr, Nd, Sm, Tb, Dy, Ho, Er, Yb and Bi); and a halide of Ca, Sr, Ba or mixtures thereof may be prepared. Then, the obtained powder mixture is sintered at a temperature of about 700° C. to about 1200° C. in a reducing atmosphere of a gaseous mixture of hydrogen and nitrogen. Herein, the amount of hydrogen in the gaseous mixture is controlled to be at least 5 volume percent (vol. %).

If the Eu oxide is used either alone or in a mixture of an Eu oxide with an oxide of at least one metal selected from a group consisting of Mn, Sb, Ce, Pr, Nd, Sm, Tb, Dy, Ho, Er, Yb and Bi. The Eu oxide or Eu oxide mixture is then doped into the inner surface of the phosphor crystals where it functions as an activator when the halosilicate phosphor emits light.

If the synthetic temperature is lower than 700° C., the synthesis reaction may not be thoroughly performed and the intensity of emission is lower than at a desired level. On the other hand, if the synthetic temperature is higher than 1200° C., the target product is melted and a glass phase is formed. Thus, the intensity of emission is reduced and desired physical properties may not be obtained.

In one exemplary embodiment the obtained sintered product may be pulverized into a powder and washed with distilled water to obtain the desired phosphor.

One or more exemplary embodiments include a white light emitting device including the halosilicate phosphor described above.

In exemplary embodiments of the white light emitting device, a LED may be either a blue LED or an UV LED. An excitation light source of the LED may have a peak wavelength of about 360 to about 470 nm.

In exemplary embodiments of the white light emitting device, the halosilicate phosphor may have a peak wavelength of about 520 to about 670 nm in the emission spectra.

Exemplary embodiments of the white light emitting device may further include at least one selected from a group consisting of a blue phosphor, a green phosphor and a red phosphor.

The blue phosphor may include at least one selected from a group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$, $Sr_2Si_3O_8.2SrCl_2:Eu^{2+}$; $Ba_3MgSi_2O_8:Eu^{2+}$; and $(Sr,Ca)_{10}(PO_4)_6.nB_2O_3:Eu^{2+}$.

The green phosphor may include at least one selected from a group consisting of $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+},Mn^{2+}$ and $BaMg_2Al_{16}O_{27}:Eu^{2+},Mn^{2+}$.

In exemplary embodiments the red phosphor may include at least one selected from a group consisting of $(Ba,Sr,Ca)_2Si_5N_8:Eu^{2+}$; $(Sr,Ca)AlSiN_3:Eu^{2+}$; $Y_2O_3:Eu^{3+},Bi^{3+}$; $(Ca,Sr)S:Eu^{2+}$; $CaLa_2S_4:Ce^{3+}$; $(Sr,Ca,Ba)_2P_2O_7:Eu^{2+},Mn^{2+}$; $(Ca,Sr)_{10}(PO_4)_6(F,Cl):Eu^{2+},Mn^{2+}$; $(Y,Lu)_2WO_6:Eu^{3+},Mo^{6+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+},Bi^{3+}$ and $(Ba,Sr,Ca)MgP_2O_7:Eu^{2+},Mn^{2+}$.

FIG. 1 is a schematic view illustrating an exemplary embodiment of the structure of a white light emitting device. The white light emitting device illustrated in FIG. 1 is a polymer lens type surface-mounted white light emitting device. In an exemplary embodiment an epoxy lens is used as the polymer lens.

Referring to FIG. 1, the UV LED chips 10 are die-bonded to the electric lead wires 30 through the gold wires 20. The epoxy mold layers 50 are formed so as to include the phosphor compositions containing a halosilicate phosphor 40 according to an exemplary embodiment. A reflective film coated with aluminum or silver is formed on an inner surface of the mold 60 to reflect light upward from the UV LED chips 10 and to limit the epoxy of the epoxy mold layers 50 to an appropriate amount.

An epoxy dome lens 70 is disposed above the epoxy mold layer 50. The shape of the epoxy dome lens 70 may be varied according to a desired orientation angle.

The white light emitting device according to one or more exemplary embodiments is not limited to the structure illustrated in FIG. 1. For example, the white light emitting device may be a phosphor-mounted light emitting device, a lamp-type light emitting device, a PCB-type surface-mounted light emitting device or the like.

Meanwhile, the halosilicate phosphor according to an exemplary embodiment may be applied to a lamp such as a mercury lamp or a xenon lamp, or to a photoluminescent liquid crystal display ("PLLCD"), in addition to a white light emitting device as described above.

Hereinafter, one or more exemplary embodiments will be described in further detail with reference to the following examples. The following examples are for illustrative purposes only and are not intended to limit the scope of the one or more exemplary embodiments.

EXAMPLE 1

Synthesis of $2CaO.SiO_2.1.2CaCl_2:0.025Eu^{2+}$

A phosphor was prepared using a solid phase reaction method. A source powder including 6.66 grams (g) of $CaCO_3$, 2 g of $SiO_2$, 0.30 g of $Eu_2O_3$ and 5.87 g of $CaCl_2.2H_2O$ was mixed using a mortar for 30 minutes. The mixed source powder was then sintered in an atmosphere of $H_2/N_2=5/95$ at 1000° C. for 8 hours. The resultant sintered sample was then pulverized using the mortar and washed with distilled water at room temperature to obtain a phosphor in powder form.

The resultant phosphor has a FWHM of 200 nm in an emission spectrum.

EXAMPLE 2

Synthesis of $2CaO.SiO_2.1.7CaCl_2:0.025Eu^{2+}$

A phosphor in powder form was manufactured in the same manner as in Example 1, except that 8.7 g of $CaCl_2.2H_2O$ was used instead of 5.87 g of $CaCl_2.2H_2O$.

The resultant phosphor has a FWHM of 165 nm in an emission spectrum.

EXAMPLE 3

Synthesis of $2CaO.SiO_2.2.1CaCl_2:0.025Eu^{2+}$

A phosphor in powder form was manufactured in the same manner as in Example 1, except that 10.7 g of $CaCl_2.2H_2O$ was used instead of 5.87 g of $CaCl_2.2H_2O$.

The resultant phosphor has a FWHM of 130 nm in an emission spectrum.

COMPARATIVE EXAMPLE 1

Synthesis of $Ca_3SiO_4Cl_2:Eu^{2+}$

A phosphor was prepared using a solid phase reaction method. A source powder including 6.66 g of $CaCO_3$, 2 g of $SiO_2$, 5.00 g of $CaCl_2.2H_2O$ and 0.30 g of $Eu_2O_3$ was mixed using a mortar for 30 minutes. The mixed powder was then placed in an alumina reaction vessel and sintered in an atmosphere of $H_2/N_2=5/95$ at 1000° C. for 8 hours. The resultant sintered sample was then pulverized using the mortar and washed with distilled water at room temperature to obtain a phosphor in powder form.

The resultant phosphor has a FWHM of 100 nm in an emission spectrum.

COMPARATIVE EXAMPLE 2

Synthesis of $Y_3Al_5O_{12}:Ce^{3+}$

A phosphor was prepared using a solid phase reaction method. A source powder including 4.00 g of $Y_2O_3$, 3.20 g of $Al_2O_3$ and 0.34 g of $CeO_2$ was mixed using a mortar for 30 minutes. The mixed powder was then placed in an alumina reaction vessel and sintered in an atmosphere of $H_2/N_2=5/95$ at 1400° C. for 6 hours. The resultant sintered sample was then pulverized using the mortar and washed with distilled water at room temperature to obtain a phosphor in powder form.

The resultant phosphor has a FWHM of 120 nm in an emission spectrum.

COMPARATIVE EXAMPLE 3

Synthesis of $Sr_2SiO_4:Eu^{2+}$

A phosphor was prepared using a solid phase reaction method. A source powder including 8.00 g of $SrCO_3$, 1.65 g of $SiO_2$ and 0.12 g of $Eu_2O_3$ was mixed using a mortar for 30 minutes. The mixed powder was then placed in an alumina reaction vessel and sintered in an atmosphere of $H_2/N_2=5/95$ at 1300° C. for 6 hours. The resultant sintered sample was then pulverized using the mortar and washed with distilled water at room temperature to obtain a phosphor in powder form.

The resultant phosphor has a FWHM of 100 nm in an emission spectrum.

Figure 2:
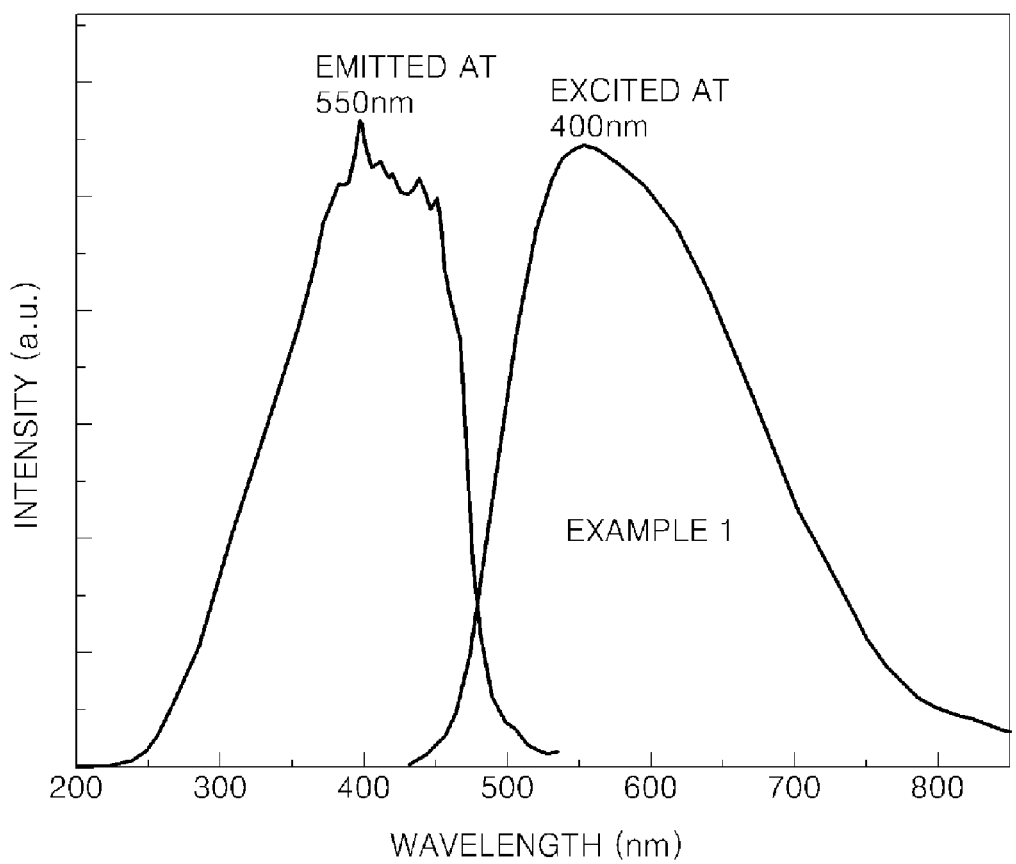
FIG. 2 is a graph showing intensity (arbitrary units, a.u.) versus wavelength (nanometers, nm) for an emission spectra of a halosilicate phosphor prepared according to Example 1 and resulting from exciting the halosilicate phosphor with a light having a wavelength of 400 nm.
Figure 3:
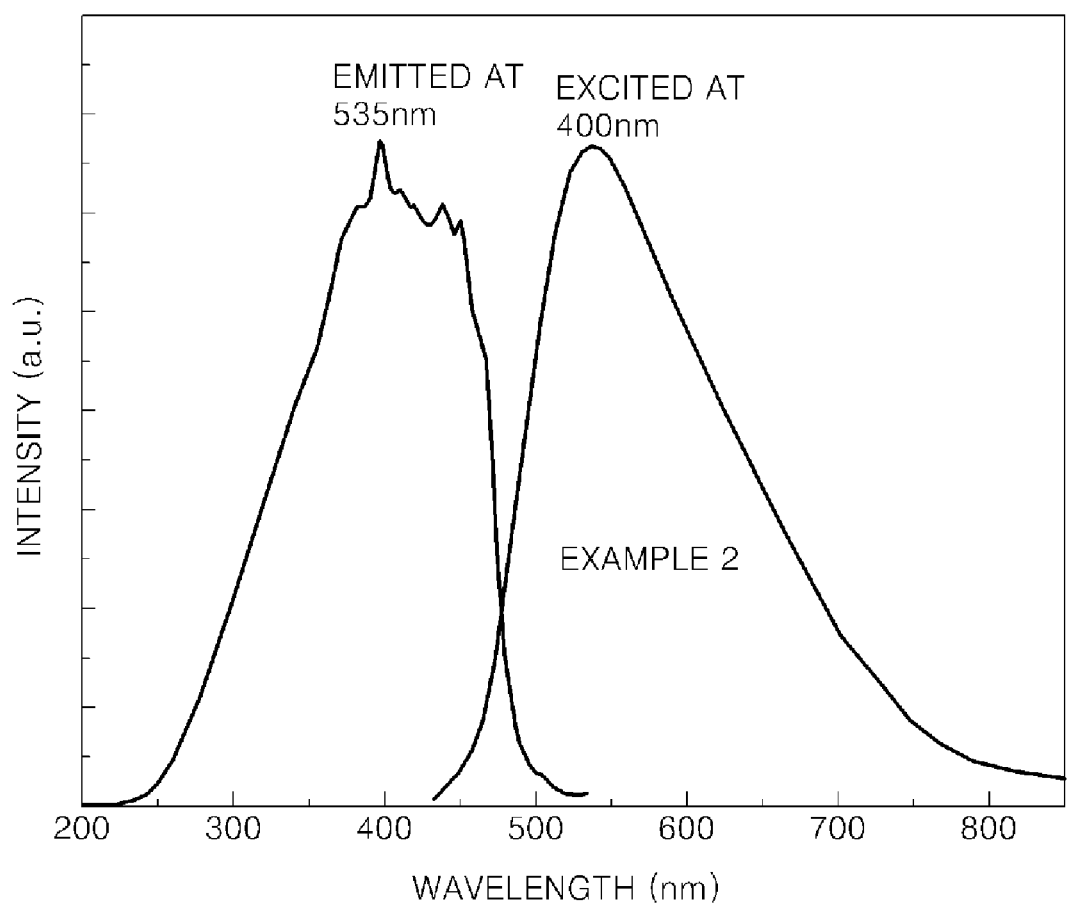
FIG. 3 is a graph showing intensity (a.u.) versus wavelength (nm) for an emission spectra of a halosilicate phosphor prepared according to Example 2 and resulting from exciting the halosilicate phosphor with a light having a wavelength of 400 nm.
Figure 4:
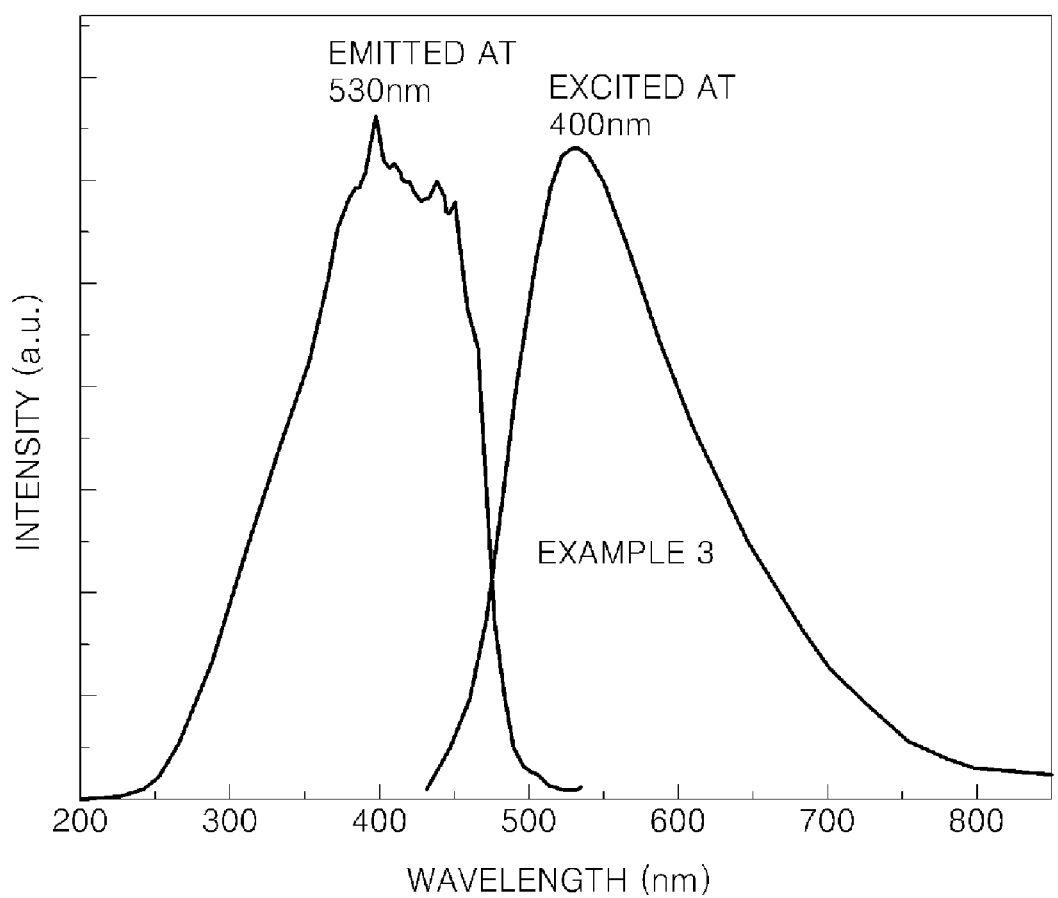
FIG. 4 is a graph showing intensity (a.u.) versus wavelength (nm) for an emission spectra of a halosilicate phosphor prepared according to Example 3 and resulting from exciting the halosilicate phosphor with a light having a wavelength of 400 nm.
Figure 5:
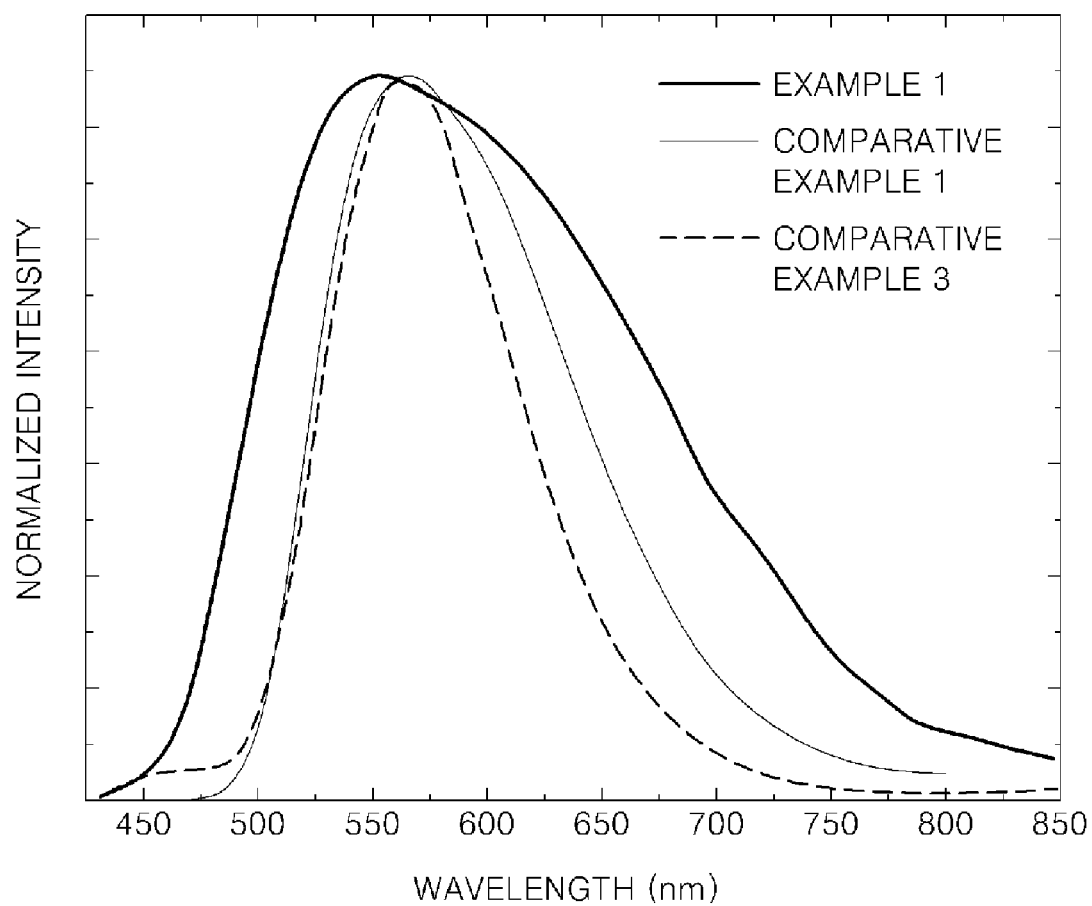
FIG. 5 is a graph showing the normalized intensity (a.u.) versus wavelength (nm) for an emission spectra of the halosilicate phosphors prepared according to Example 1, Comparative Example 1 and Comparative Example 3.

FIGS. 2 through 4 are graphs of intensity (a.u.) versus wavelength (nm) for the emission spectra of the phosphors prepared in Examples 1 through 3, and resulting from the phosphors being excited with a light having a wavelength of 400 nm. FIG. 5 is a graph showing the normalized intensity (a.u.) versus wavelength (nm) for the emission spectra of the phosphors prepared in Example 1 and Comparative Examples 2 and 3. Referring to FIG. 5, it can be seen that the FWHM of a phosphor according to an exemplary embodiment is relatively wide.

Figure 6:
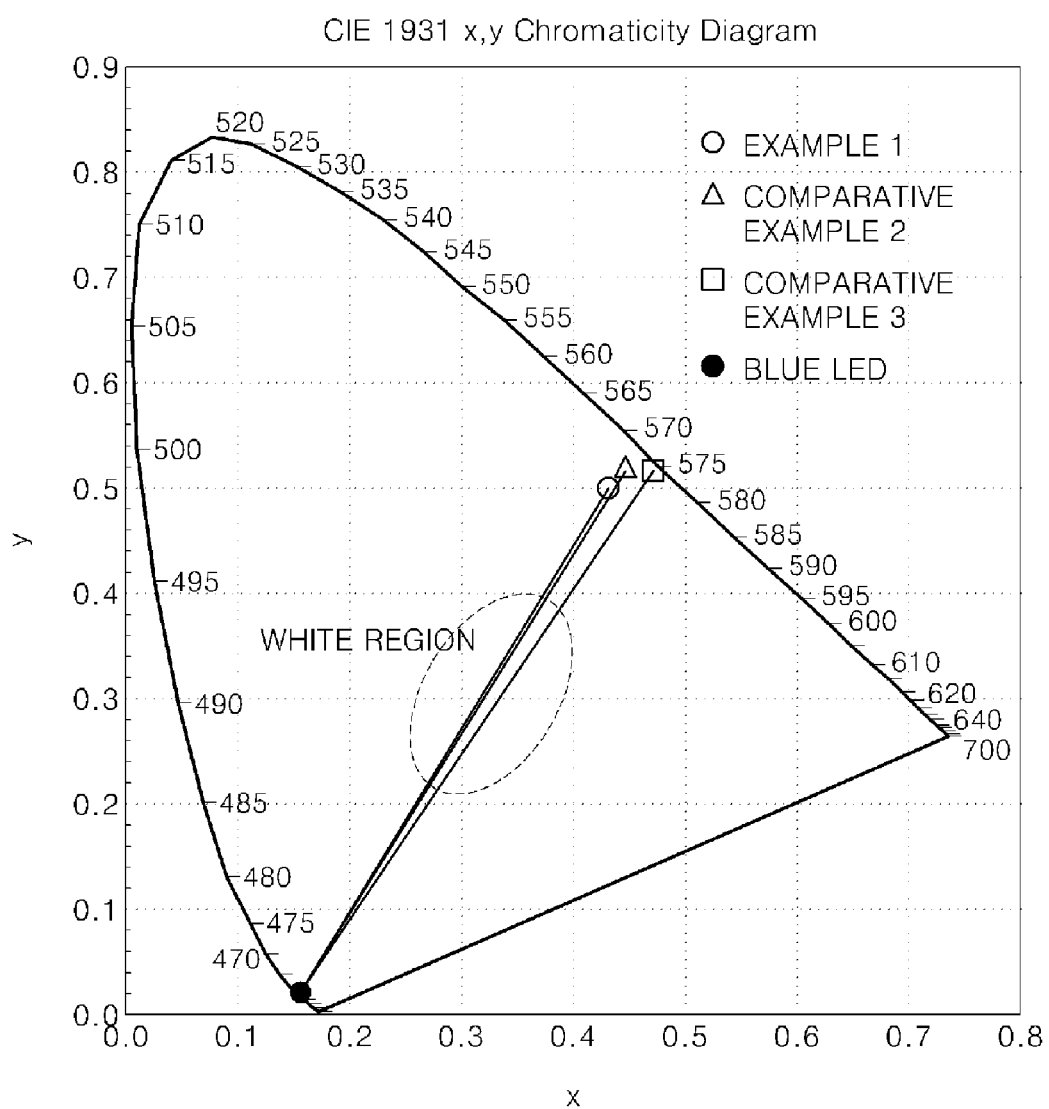
FIG. 6 is a graph showing the chromaticity coordinates (x, y) of the halosilicate phosphors prepared according to Example 1, Comparative Example 1, Comparative Example 3, and a blue light emitting diode ("LED")

FIG. 6 is a graph showing the chromaticity coordinates (x, y) of the phosphors prepared in Example 1 and Comparative Examples 2 and 3. Referring to FIG. 6, it can be seen that white light may be emitted by applying the phosphor to a blue LED in combination with $Y_3Al_5O_{12}:Ce^{3+}$ or $Sr_2SiO_4:Eu^{2+}$.

Figure 7:
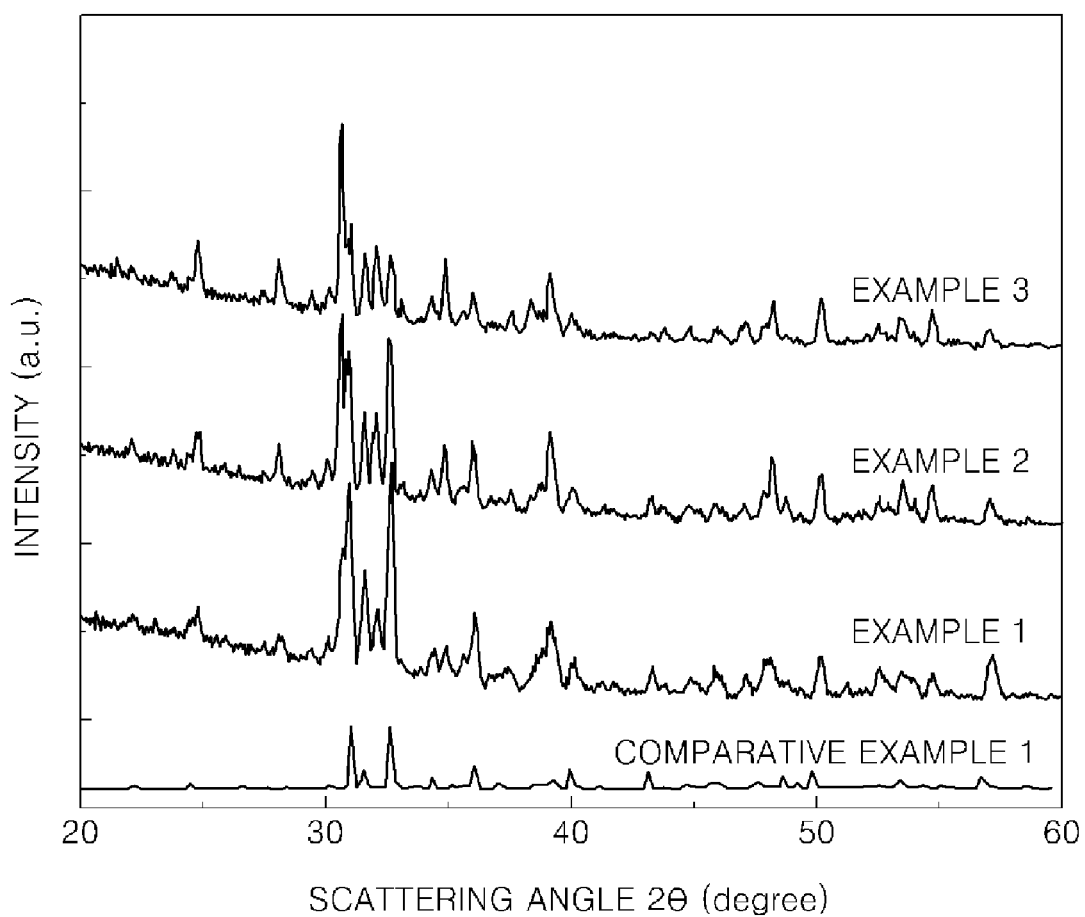
FIG. 7 is a graph showing intensity (a.u.) versus scattering angle 2θ (degree) for the X-ray diffraction ("XRD") of the halosilicate phosphors prepared according to Example 1, Example 2, Example 3 and Comparative Example 1.

FIG. 7 is a graph showing intensity (a.u.) versus scattering angle 2θ (degree) for the X-ray diffraction ("XRD") of the phosphors prepared in Examples 1 through 3 according to exemplary embodiments and Comparative Example 1. Referring to FIG. 7, as the amount of $CaCl_2$ in the reaction precursor increases within a constant range, the relative intensity of the new peak, which does not appear in Comparative Example 1, also increases. Therefore, a halosilicate phosphor according to an exemplary embodiment is not a single phase material but is instead a mixture of at least two phases. In addition, as the r/q ratio increases to 1.7 and 2.1 from 1.2, a relative amount of the new phase increases compared to the known $Ca_3SiO_4Cl_2$ phase. In addition, it can be seen that the change in the emission peak of FIGS. 2 to 4 originates from the increase of the new phase.

As described above, according to one or more of the above exemplary embodiments, the halosilicate phosphor has a large FWHM, and the white light emitting device including the halosilicate phosphor has excellent color rendering properties.

It should be understood that the exemplary embodiments described herein should be considered in a descriptive sense only and not for the purposes of limitation. Descriptions of features or aspects within each embodiment should typically be considered as available for other similar features or aspects in other embodiments.

What is claimed is:

1. A halosilicate phosphor represented by Formula 1:

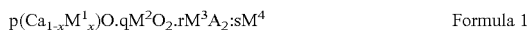   Formula 1 wherein
  $M^1$ comprises at least one selected from a group consisting of $Sr^{2+}$ and $Ba^{2+}$;
  $M^2$ comprises at least one selected from a group consisting of $Si^{4+}$ and $Ge^{4+}$;
  $M^3$ comprises at least one selected from a group consisting of $Ca^{2+}$, $Sr^{2+}$ and $Ba^{2+}$;
  $M^4$ comprises at least one selected from a group consisting of $Eu^{2+}$, $Mn^{2+}$, $Sb^{2+}$, $Ce^{3+}$, $Pr^{3+}$, $Nd^{3+}$, $Sm^{3+}$, $Tb^{3+}$, $Dy^{3+}$, $Ho^{3+}$, $Er^{3+}$, $Yb^{3+}$ and $Bi^{3+}$; and A comprises at least one selected from a group consisting of $F^-$, $Cl^-$, $Br^-$ and $I^-$,
  wherein $0 \leq x < 1$, $1.8 \leq p \leq 2.2$, $0.8 \leq q \leq 1.2$, $1 < r/q < 3$ and $0 < s < 0.5$, and
  wherein the halosilicate phosphor has a full width at half maximum of about 125 nm to about 220 nm in an emission spectra.

2. A white light emitting device comprising a light emitting diode and a halosilicate phosphor represented by Formula 1:

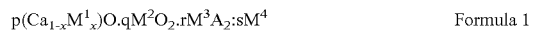   Formula 1 wherein
  $M^1$ comprises at least one selected from a group consisting of $Sr^{2+}$ and $Ba^{2+}$;
  $M^2$ comprises at least one selected from a group consisting of $Si^{4+}$ and $Ge^{4+}$;
  $M^3$ comprises at least one selected from a group consisting of $Ca^{2+}$, $Sr^{2+}$ and $Ba^{2+}$;
  $M^4$ comprises at least one selected from a group consisting of $Eu^{2+}$, $Mn^{2+}$, $Sb^{2+}$, $Ce^{3+}$, $Pr^{3+}$, $Nd^{3+}$, $Sm^{3+}$, $Tb^{3+}$, $Dy^{3+}$, $Ho^{3+}$, $Er^{3+}$, $Yb^{3+}$ and $Bi^{3+}$;
  A comprises at least one selected from a group consisting of $F^-$, $Cl^-$, $Br^-$ and $I^-$; $0 \leq x < 1$, $1.8 \leq p \leq 2.2$, $0.8 \leq q \leq 1.2$, $1 < r/q < 3$ and $0 < s < 0.5$ and wherein the halosilicate phosphor has a full width at half maximum of about 125 nm to about 220 nm in an emission spectra.

3. The white light emitting device of claim 2, wherein the light emitting diode is at least one selected from a group consisting of a blue light emitting diode and an ultraviolet light emitting diode.

4. The white light emitting device of claim 2, further comprising at least one selected from a group consisting of a blue phosphor, a green phosphor and a red phosphor.

5. The white light emitting device of claim 4, wherein the blue phosphor comprises at least one selected from a group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$; $Sr_2Si_3O_8 \cdot 2SrCl_2:Eu^{2+}$; $Ba_3MgSi_2O_8:Eu^{2+}$ and $(Sr,Ca)_{10}(PO_4)_6 \cdot nB_2O_3:Eu^{2+}$.

6. The white light emitting device of claim 4, wherein the green phosphor comprises at least one selected from a group consisting of $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+}$, $Mn^{2+}$ and $BaMg_2Al_{16}O_{27}:Eu^{2+}$, $Mn^{2+}$.

7. The white light emitting device of claim 4, wherein the red phosphor comprises at least one selected from a group consisting of $(Ba,Sr,Ca)_2Si_5N_8:Eu^{2+}$; $(Sr,Ca)AlSiN_3:Eu^{2+}$; $Y_2O_3:Eu^{3+},Bi^{3+}$; $(Ca,Sr)S:Eu^{2+}$; $CaLa_2S_4:Ce^{3+}$; $(Sr,Ca,Ba)_2P_2O_7:Eu^{2+},Mn^{2+}$; $(Ca,Sr)_{10}(PO_4)_6(F,Cl):Eu^{2+}$, $Mn^{2+}$; $(Y,Lu)_2WO_6:Eu^{3+},Mo^{6+}$; $(Gd,Y,Lu,La)_2O_3Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+}$, $Bi^{3+}$ and $(Ba,Sr,Ca)MgP_2O_7:Eu^{2+},Mn^{2+}$.

8. The white light emitting device of claim 2, wherein the halosilicate phosphor has a peak wavelength of about 520 nm to about 670 nm in an emission spectra.

9. The white light emitting device of claim 2, wherein the white light emitting device is used in a traffic light, as a light source for communication devices, as a backlight for a display device, or as an illumination application.

* * * * *